United States Patent
Yoon et al.

(10) Patent No.: US 8,576,619 B2
(45) Date of Patent: Nov. 5, 2013

(54) PHASE CHANGE RANDOM ACCESS MEMORY APPARATUS PERFORMING A FIRING OPERATION

(75) Inventors: Jung Hyuk Yoon, Icheon-si (KR); Dong Keun Kim, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 143 days.

(21) Appl. No.: 13/219,629

(22) Filed: Aug. 27, 2011

(65) Prior Publication Data

US 2012/0195113 A1  Aug. 2, 2012

(30) Foreign Application Priority Data

Jan. 28, 2011  (KR) .................. 10-2011-0009086

(51) Int. Cl.
*G11C 11/00* (2006.01)
(52) U.S. Cl.
USPC ........................ 365/163; 365/148; 365/201
(58) Field of Classification Search
USPC .......................... 365/163, 148, 201
See application file for complete search history.

(56) References Cited

U.S. PATENT DOCUMENTS

| | | | | |
|---|---|---|---|---|
| 5,365,481 A | * | 11/1994 | Sawada | 365/201 |
| 2008/0074919 A1 | * | 3/2008 | Lim et al. | 365/163 |
| 2008/0106930 A1 | * | 5/2008 | Kim et al. | 365/163 |
| 2010/0195377 A1 | * | 8/2010 | Kim | 365/163 |

FOREIGN PATENT DOCUMENTS

KR   100781550 B1   11/2007

* cited by examiner

*Primary Examiner* — Richard Elms
*Assistant Examiner* — Hien Nguyen
(74) *Attorney, Agent, or Firm* — William Park & Associates Patent Ltd.

(57) ABSTRACT

A phase change random access memory (PCRAM) apparatus includes: a memory cell array including a plurality of phase change memory cells; and a firing control unit configured to provide a firing voltage for firing the plurality of phase change memory cells to a global bit line in response to an enable signal based on a test mode signal.

21 Claims, 3 Drawing Sheets

PHASE CHANGE RANDOM ACCESS MEMORY APPARATUS PERFORMING A FIRING OPERATION

CROSS-REFERENCES TO RELATED APPLICATION

The present application claims priority under 35 U.S.C. §119(a) to Korean application number 10-2011-0009086, filed on Jan. 28, 2011, in the Korean Intellectual Property Office, which is incorporated herein by reference in its entirety.

BACKGROUND

1. Technical Field

The present invention relates generally to a semiconductor integrated circuit, and more particularly, to a phase change random access memory (PCRAM) apparatus.

2. Related Art

A phase change random access memory (PCRAM) apparatus stores data by using a phase change material which is changed into a crystalline state or an amorphous state by being cooled after being heated.

A phase change material in a crystalline state has low resistance, and a phase change material in an amorphous state has high resistance. Thus, the crystalline state may be defined as set or data '0', and the amorphous state may be defined as reset or data '1'.

In general, a PCRAM apparatus performs a firing process so that a phase change can normally occur.

By a firing process, a larger amount of firing current than the reset current is supplied to the memory cells, and this removes the impurities remaining on the surface of a PCRAM.

In particular, during a firing process, an amount of current that is larger than the amount supplied by a write driver needs to be provided to the memory cells.

To do this, a test mode is applied to a pulse width control unit that outputs a pulse width control signal for controlling the current amount proportional to the pulse width, so that the pulse width of a desired duration that is longer than a preset time is provided to a write driver. Then, because the pulse width is set to a larger value than a preset time, a larger amount of current can be provided.

However, there is a limitation as to the maximum high-voltage level that can be provided to a write driver, and as a result is there is also a limitation in the current amount that can be supplied to a memory cell in comparison to the rate of the high voltage level increase.

Furthermore, too high voltage when supplied to a write driver could destroy the transistors in the write driver.

In addition, for a sufficient firing process, the current needs to be supplied for a lengthy period of time, and this may appear to present no significant problems when performing a firing process on a small number of memory cells; however, a firing operation in general is performed on all memory cells, not just on a few among many memory cells. Therefore, an undesirably lengthy test will inevitably take place.

There are proposed techniques to perform a firing operation on a plurality of memory cells simultaneously; however, it would be difficult realize because a write driver has no ability of driving a plurality of memory cells.

SUMMARY

A phase change random access memory (PCRAM) apparatus as described herein provides new and significantly improved features and advantages to the memory cell characteristics.

In an embodiment of the present invention, a PCRAM apparatus includes, inter alia: a memory cell array including a plurality of phase change memory cells; a write driving unit configured to provide a write signal to the plurality of phase change memory cells, by using a high voltage applied from outside; and a firing control unit configured to provide a firing voltage for firing the plurality of phase change memory cells to a global bit line in response to an enable signal based on a test mode signal, during a firing operation.

BRIEF DESCRIPTION OF THE DRAWINGS

Features, aspects, and embodiments are described in conjunction with the attached drawings, in which.

DETAILED DESCRIPTION

Hereinafter, a phase change random access memory (PCRAM) apparatus according to the present invention will be described below with reference to the accompanying drawings through exemplary embodiments.

Figure 1:
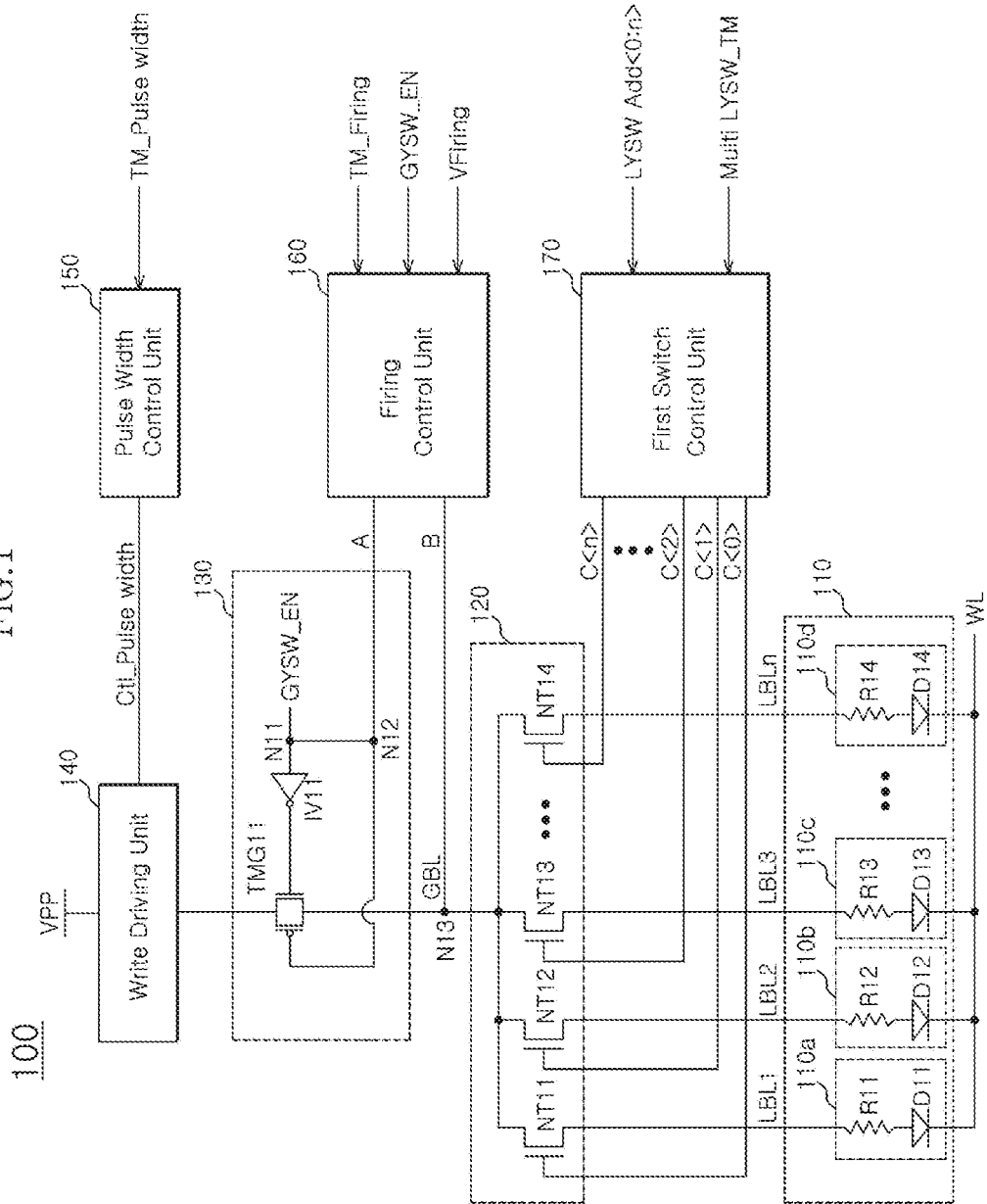
FIG. 1 is a block diagram illustrating a PCRAM apparatus according to an embodiment of the present invention.

FIG. 1 is a block diagram illustrating a PCRAM apparatus 100 according to an embodiment of the present invention.

Referring to FIG. 1, the PCRAM apparatus 100 according to an embodiment of the present invention includes a memory cell array 110, a first switching unit 120, a second switching unit 130, a write driving unit 140, a pulse width control unit 150, a firing control unit 160, and a first switch control unit 170.

The memory array cell array 100 may include a plurality of memory banks, and each of the memory banks may include a plurality of memory blocks. Furthermore, each of the memory blocks may include a plurality of phase change memory cells 110-1 to 110-$n$ arranged, for example, in a matrix shape. In this disclosure, "n" represents a positive integer.

The phase memory cells 110-1 to 110-$n$ are coupled between local bit lines LBL1 to LBLn and a word line WL, and include variable resistor elements R11 to R1$n$ and access elements D11 to D1$n$, respectively. The variable resistor elements R11 to R1$n$ include a phase change material having two or more different resistance values according to a crystalline state or an amorphous state, and the access elements D11 to D1$n$ are configured to control currents flowing in the variable resistor elements R11 to R1$n$.

The access elements D11 to D1$n$ may be diodes or transistors coupled in series to the variable resistor elements R11 to R1$n$. Furthermore, the phase change material can be of a variety of materials including, for example, GaSb, InSb, InSe, Sb2Te3, GeTe of two element combination; GeSbTe, GaSeTe, InSbTe, SnSb2Te4, InSbGe of three element combination; AgInSbTe, (GeSn)SbTe, GeSb(SeTe), Te81Ge15SbS2 of four element combination, etc. In particular, GeSbTe composed of Ge, Sb, and Te may be considered as the more frequently used phase change material among the above.

The first switching unit 120 may enable one local bit line among the plurality of local bit lines LBL1 to LBLn in response to local bit line enable signals C<0:n> outputted from the first switch control unit 170.

The first switching unit 120 may include a plurality of NMOS transistors NT11 to NT1n.

The second switching unit 130 may enable a global bit line GBL coupled to the first switching unit 120 in response to a global bit line enable signal (hereinafter, referred to as a first combination signal A) outputted from the firing control unit 160. The second switching unit 130 may include a transmission gate TMG11.

The write driving unit 140 may provide a write signal to the respective phase change memory cells 110-1 to 110-n, during a write operation. The write driving unit 140 receives a high voltage VPP.

The pulse width control unit 150 may receive a test mode signal TM_Pulse width, and generate a pulse width control signal Ctl_Pulse width having a period longer than a preset pulse period to control an amount of firing current to be applied to a memory cell, so that the generated pulse width control signal Ctl_Pulse width can be provided to the write driving unit 140 during a firing operation.

The firing control unit 160 may provide a firing voltage for firing the plurality of phase change memory cells 110-1 to 110-n to the global bit line GBL in response to an enable signal TM_Firing based on a firing test mode signal.

Figure 2:
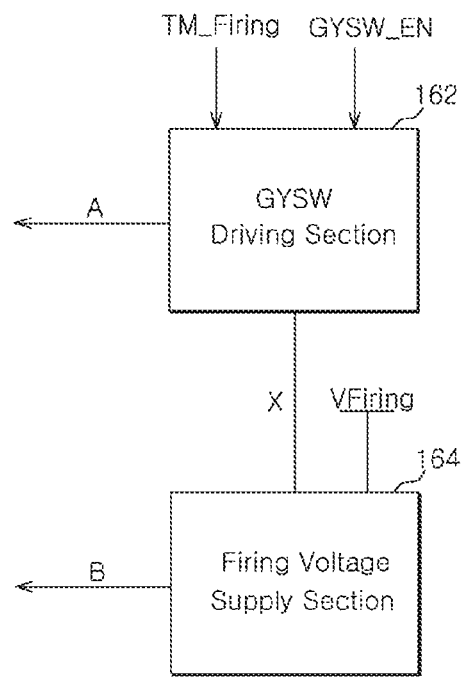
FIG. 2 is a detailed block diagram of a firing control unit of FIG. 1.

More specifically, referring to FIG. 2, the firing control unit 160 according to an embodiment of the present invention may include a GYSW driving section (hereinafter, referred to as a second switch driving section) 162 and a firing voltage supply section 164. The second switch driving section 162 is configured to combine a second switch control signal GYSW_EN and the enable signal TM_Firing based on the test mode signal and generate first and second combination signals A and X. The firing voltage supply section 164 is configured to supply a firing voltage provided from a firing pad VFiring to the global bit line GBL in response to the second combination signal X.

The firing voltage B which is higher than the high voltage VPP applied to the write driving unit 140 may be provided to the global bit line GBL during a firing operation.

Figure 3:
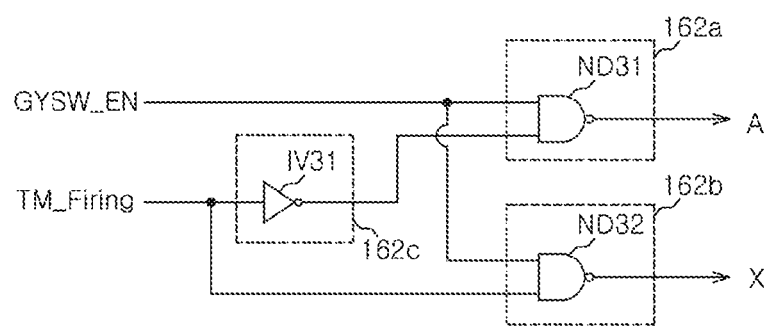
FIG. 3 is a detailed circuit diagram of a GYSW driving section of FIG. 1.

Referring to FIG. 3, the second switch driving section 162 may include a first combiner 162a and a second combiner 162b. The first combiner 162a is configured to generate the first combination signal A for controlling the second switching unit 130 in response to the enable signal TM_Firing based on the test mode signal and the second switch control signal GYSW_EN. The test enable signal TM_Firing based on the test mode signal may be inverted by an inverter IV31 and provided to the first combiner 162a. The second combiner 162b is configured to generate the second combination signal X for controlling the firing voltage supply section 164 in response to the second switch control signal GYSW_EN. The first combination section 162a may include a NAND gate ND31, and the second combination section 162b may include a NAND gate ND32.

Figure 4:
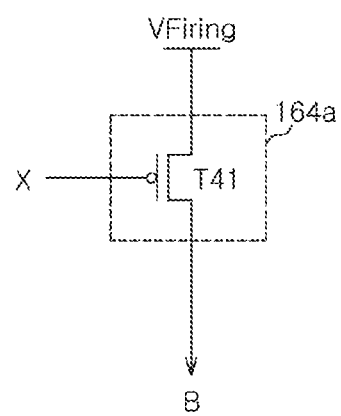
FIG. 4 is a detailed circuit diagram of a firing voltage supply section of FIG. 2.

Referring to FIG. 4, the firing voltage supply section 164 may include a PMOS transistor T41 configured to receive the second combination signal X through its gate. The firing voltage supply section 164 may supply the firing voltage B provided from the firing pad VFiring to the global bit line GBL in response to the second combination signal X.

Hereinafter, the operation of the firing control unit 160 according to an embodiment of the present invention will be described. When the second switch control signal GYSW_EN and the enable signal TM_Firing based on the test mode signal are inputted at a high level, that is, when a firing operation is performed, the second switching unit 130 does not operate, because the first combiner 162a outputs a high-level first combination signal A.

However, the second combiner 162b outputs a low-level second combination signal X and provides the low-level second combination signal X to the firing voltage supply section 164. Accordingly, the firing voltage supply section 164 is driven by the status of the second combination signal X.

When the firing voltage supply section 164 is driven, the potential of the node N13 becomes high, because a high-level firing voltage B provided from the firing pad VFiring is provided to the global bit line GBL as illustrated in FIG. 4.

On the other hand, when at least one of the second switch control signal GYSW_EN and the enable signal TM_Firing based on the test mode signal is inputted at a low level, that is, when the firing operation is not performed, the first combiner 162a outputs a low-level first combination signal A to the second switching unit 130. Accordingly, the second switching 130 would then operate in this case.

The second combination unit 162b outputs a high-level second combination signal X and provides the high-level second combination signal X to the firing voltage supply section 164. Accordingly, the firing voltage supply section 164 would not operate in this case.

According to an embodiment of the present invention, the first switch control unit 170 may combine a plurality of local bit line addresses LYSW Add<0:n> and a test mode signal Multi LYSW_TM and generate local bit line enable signals C<0:n> to drive one or more of the plurality of memory cells 110-1 to 110-n.

According to an embodiment of the present invention, the PCRAM apparatus 100 may provide a firing voltage provided from the firing pad Vfiring to the phase change memory cells 110-1 to 110-n during a firing operation.

That is, since the PCRAM apparatus 100 in an embodiment of the present invention uses the firing voltage B of a high voltage, the PCRAM apparatus 100 may operate a desired number of local switches, that is, the first switching unit 120 and fire a plurality of is phase change memory cells at the same time. Therefore, it makes possible to reduce the test time.

While certain embodiments have been described above, it will be understood to those skilled in the art that the embodiments described are by way of example only. Accordingly, the PCRAM apparatus described herein should not be limited based on the described embodiments. Rather, the PCRAM apparatus described herein should only be limited in light of the claims that follow when taken in conjunction with the above description and accompanying drawings.

What is claimed is:

1. A phase change random access memory (PCRAM) apparatus comprising:
   a memory cell array comprising a plurality of phase change memory cells;
   a firing control unit configured to provide a firing voltage for firing the plurality of phase change memory cells to a global bit line in response to an enable signal based on a test mode signal;
   a second switching unit configured to electrically connect the memory cell array with a write driving unit through the global bit line during a write operation and electrically disconnect the memory cell array with the write driving unit during a firing operation; and
   the write driving unit configured to receive a high voltage and provide a write signal to the memory cell array utilizing the high voltage when the write driving unit is electrically connected with the memory cell array.

2. The PCRAM apparatus according to claim 1, further comprising:

a pulse width control unit configured to receive the test mode signal, and generate a pulse width control signal having a period longer than a preset pulse period to control an amount of firing current to be applied to the memory cell array, so as to provide the generated pulse width control signal to the write driving unit during the firing operation.

3. The PCRAM apparatus according to claim 2, further comprising:
a first switching unit,
wherein the first switching unit is configured to enable one or more local bit lines in response to a local bit line enable signal; and
the second switching unit is configured to enable the global bit line in response to an activated first combination signal provided from the firing control unit, wherein the signal levels of activated and deactivated signals are of two predetermined signal levels different from each other.

4. The PCRAM apparatus according to claim 3, wherein the firing control unit comprises:
a second switch driving section configured to combine the enable signal based on the test mode signal and a second switch control signal and generate the activated first combination signal and an activated second combination signal; and
a firing voltage supply section configured to provide the firing voltage to the global bit line in response to the activated second combination signal.

5. The PCRAM apparatus according to claim 4, wherein the firing voltage is inputted from an external pad and wherein the firing voltage level is higher than the high voltage level.

6. The PCRAM apparatus according to claim 5, wherein the second switch driving section comprises:
a first combiner configured to combine the enable signal based on the test mode signal and the second switch control signal and generate the activated first combination signal for controlling the second switching unit; and
a second combiner configured to combine the enable signal based on the test mode signal and the second switch control signal and generate the activated second combination signal for controlling the firing voltage supply section.

7. The PCRAM apparatus according to claim 6, wherein, when the enable signal based on the test mode signal and the second switch control signal are activated and inputted to the second switch driving section, the firing control unit deactivates the second combination signal to enable the firing voltage supply section.

8. The PCRAM apparatus according to claim 7, wherein, when the firing voltage supply section is enabled, the firing control unit provides the firing voltage to the global bit line to perform the firing operation for the phase change memory cells.

9. The PCRAM apparatus according to claim 6, wherein, when any one of the enable signal based on the test mode signal and the second switch control signal is deactivated and inputted to the second switch driving section, the firing control unit deactivates the first combination signal.

10. The PCRAM apparatus according to claim 9, wherein the firing control unit provides the deactivated first combination signal to the second switching unit to turn on the second switching unit.

11. The PCRAM apparatus according to claim 1, further comprising a first switch control unit configured to combine a plurality of local bit line addresses and the test mode signal and generate one or more local bit line enable signals.

12. A PCRAM apparatus comprising:
a memory cell array comprising a plurality of phase change memory cells;
a write driving unit configured to receive a high voltage and provide a write signal to the plurality of phase change memory cells utilizing the high voltage when the write driving unit is electrically connected with the plurality of phase change memory cells;
a firing control unit configured to provide a firing voltage for firing the plurality of phase change memory cells to a global bit line in response to an enable signal based on a test mode signal during a firing operation; and
a second switching unit configured to electrically connect the memory cell array with the write driving unit through the global bit line during a write operation and electrically disconnect the memory cell array with the write driving unit during the firing operation.

13. The PCRAM apparatus according to claim 12, further comprising a pulse width control unit configured to receive the test mode signal, and generate a pulse width control signal having a period longer than a preset pulse period to control an amount of firing current to be applied to the memory cell array, so as to provide the generated pulse width control signal to the write driving unit during the firing operation.

14. The PCRAM apparatus according to claim 12, further comprising:
a first switching unit,
wherein the first switching unit is configured to enable one or more local bit lines in response to a local bit line enable signal; and
the second switching unit is configured to enable the global bit line in response to an activated first combination signal provided from the firing control unit,
wherein the signal levels of activated and deactivated signals are of two predetermined signal levels different from each other; and
wherein the second switching unit, when enabled during the write operation, provides the high voltage received from write driving unit to the global bit line.

15. The PCRAM apparatus according to claim 14, wherein the firing control unit comprises:
a second switch driving section configured to combine the enable signal based on the test mode signal and a switch control signal and generate the activated first combination signal and an activated second combination signal; and
a firing voltage supply section configured to provide the firing voltage to the global bit line in response to the activated second combination signal.

16. The PCRAM apparatus according to claim 15, wherein the firing voltage is inputted from an external pad and wherein the firing voltage level is higher than the high voltage level.

17. The PCRAM apparatus according to claim 16, wherein the second switch driving section comprises:
a first combiner configured to combine the enable signal based on the test mode signal and the second switch control signal and generate the activated first combination signal for controlling the second switching unit; and
a second combiner configured to combine the enable signal based on the test mode signal and the second switch control signal and generate the activated second combination signal for controlling the firing voltage supply section.

18. The PCRAM apparatus according to claim 16, wherein, when the enable signal based on the test mode signal and the second switch control signal are activated and inputted to the second switch driving section, the firing control unit deactivates the second combination signal to enable the firing voltage supply section.

19. The PCRAM apparatus according to claim 18, wherein, when the firing voltage supply section is enabled, the firing control unit provides the firing voltage to the global bit line to perform the firing operation for the phase change memory cells.

20. The PCRAM apparatus according to claim 17, wherein, when any one of the enable signal based on the test mode signal and the second switch control signal is deactivated and inputted to the second switch driving section, the firing control unit deactivates the first combination signal.

21. The PCRAM apparatus according to claim 20, wherein the firing control unit provides the deactivated first combination signal to the second switching unit to turn on the second switching unit.

* * * * *